United States Patent
Schaerrer et al.

(10) Patent No.: US 7,965,162 B2
(45) Date of Patent: Jun. 21, 2011

(54) CURRENT SENSOR

(75) Inventors: Marc Schaerrer, Bernex (CH); Pascal Morel, St. Pierre en Faucigny (FR); Bernard Richard, Grens (CH); Pierre Cattaneo, Collonges-sous-Saleve (FR)

(73) Assignee: Liaisons Electroniques-Mecaniques LEM S.A., Plan-les-Ouates (CH)

( * ) Notice: Subject to any disclaimer, the term of this patent is extended or adjusted under 35 U.S.C. 154(b) by 754 days.

(21) Appl. No.: 11/572,189

(22) PCT Filed: Jul. 6, 2005

(86) PCT No.: PCT/IB2005/002017
§ 371 (c)(1),
(2), (4) Date: Jan. 16, 2007

(87) PCT Pub. No.: WO2006/008629
PCT Pub. Date: Jan. 26, 2006

(65) Prior Publication Data
US 2008/0094162 A1   Apr. 24, 2008

(30) Foreign Application Priority Data
Jul. 16, 2004   (EP) .................................. 04405458

(51) Int. Cl.
H01F 17/06   (2006.01)
H01F 17/00   (2006.01)
(52) U.S. Cl. .................... 336/175; 336/177; 336/178
(58) Field of Classification Search .................. 336/175, 336/177, 178
See application file for complete search history.

(56) References Cited

U.S. PATENT DOCUMENTS

| 3,465,238 | A | * | 9/1969 | Marlow | 340/870.31 |
|---|---|---|---|---|---|
| 5,004,974 | A | * | 4/1991 | Cattaneo et al. | 324/117 R |
| 5,552,700 | A | * | 9/1996 | Tanabe et al. | 324/117 H |
| 6,064,192 | A | | 5/2000 | Redmyer | |
| 6,844,799 | B2 | * | 1/2005 | Attarian et al. | 335/18 |
| 2003/0117250 | A1 | * | 6/2003 | Schirmer | 336/131 |
| 2003/0160601 | A1 | | 8/2003 | Lenhard | |

FOREIGN PATENT DOCUMENTS

| JP | 2000-284000 A | 10/2000 |
|---|---|---|
| JP | 2001-194391 A | 7/2001 |
| WO | 01/40812 A2 | 6/2001 |

OTHER PUBLICATIONS

International Search Report cited in corresponding International Application, dated Nov. 18, 2005, 6 pages.

* cited by examiner

Primary Examiner — Anh T Mai
Assistant Examiner — Ronald W Hinson
(74) Attorney, Agent, or Firm — Baker & Daniels LLP

(57) ABSTRACT

An electrical current sensor comprises a magnetic circuit with an air-gap, a magnetic field sensor positioned in the air-gap, and a secondary coil surrounding a branch of the magnetic circuit. The magnetic circuit comprises at least two parts (18, 20) that are assembled together, a branch portion (45, 46) of each part being insertably received in a central cavity of the secondary coil in an axial direction (A). The air-gap (30) is arranged between overlapping branch portions of each magnetic field circuit part.

25 Claims, 9 Drawing Sheets

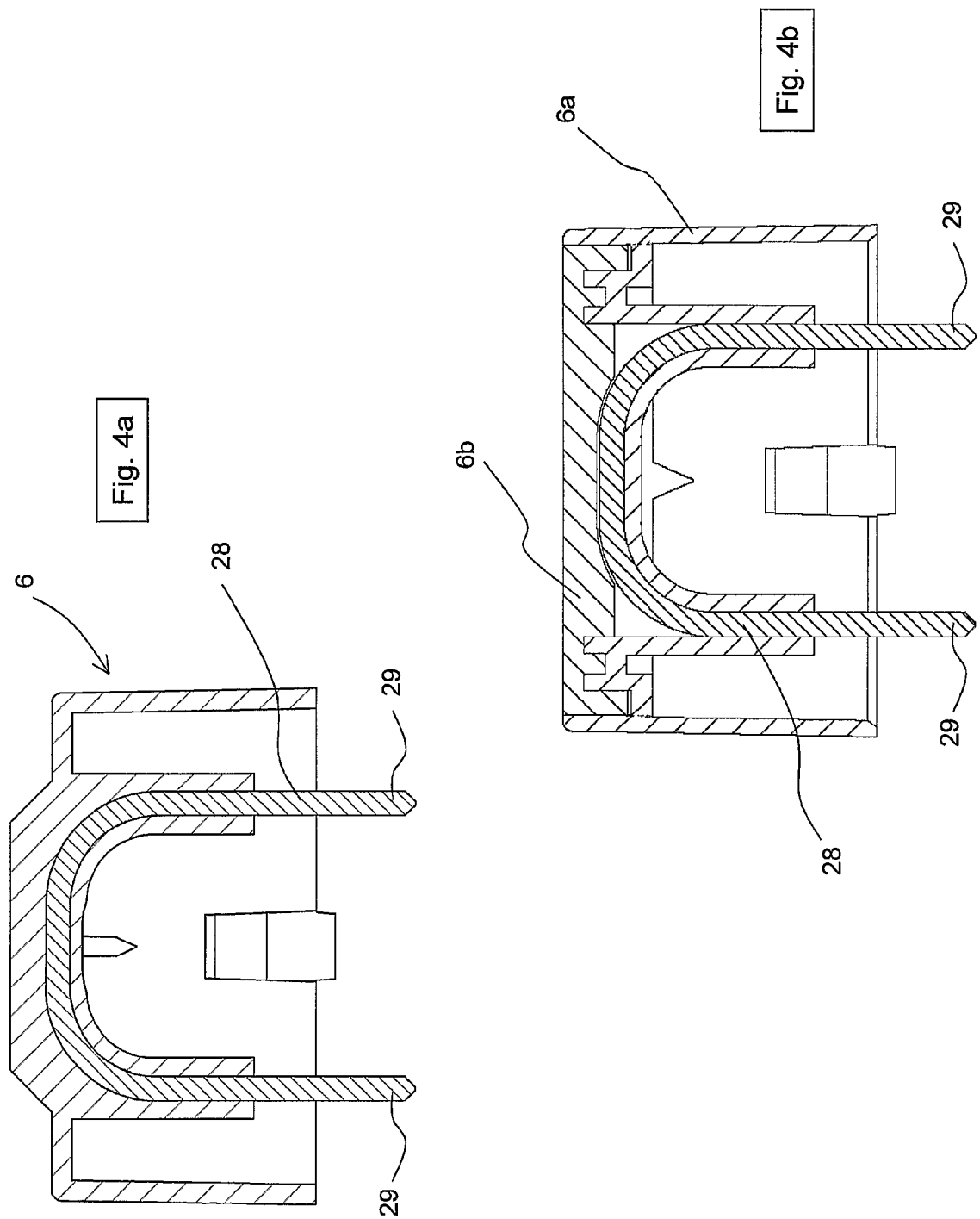

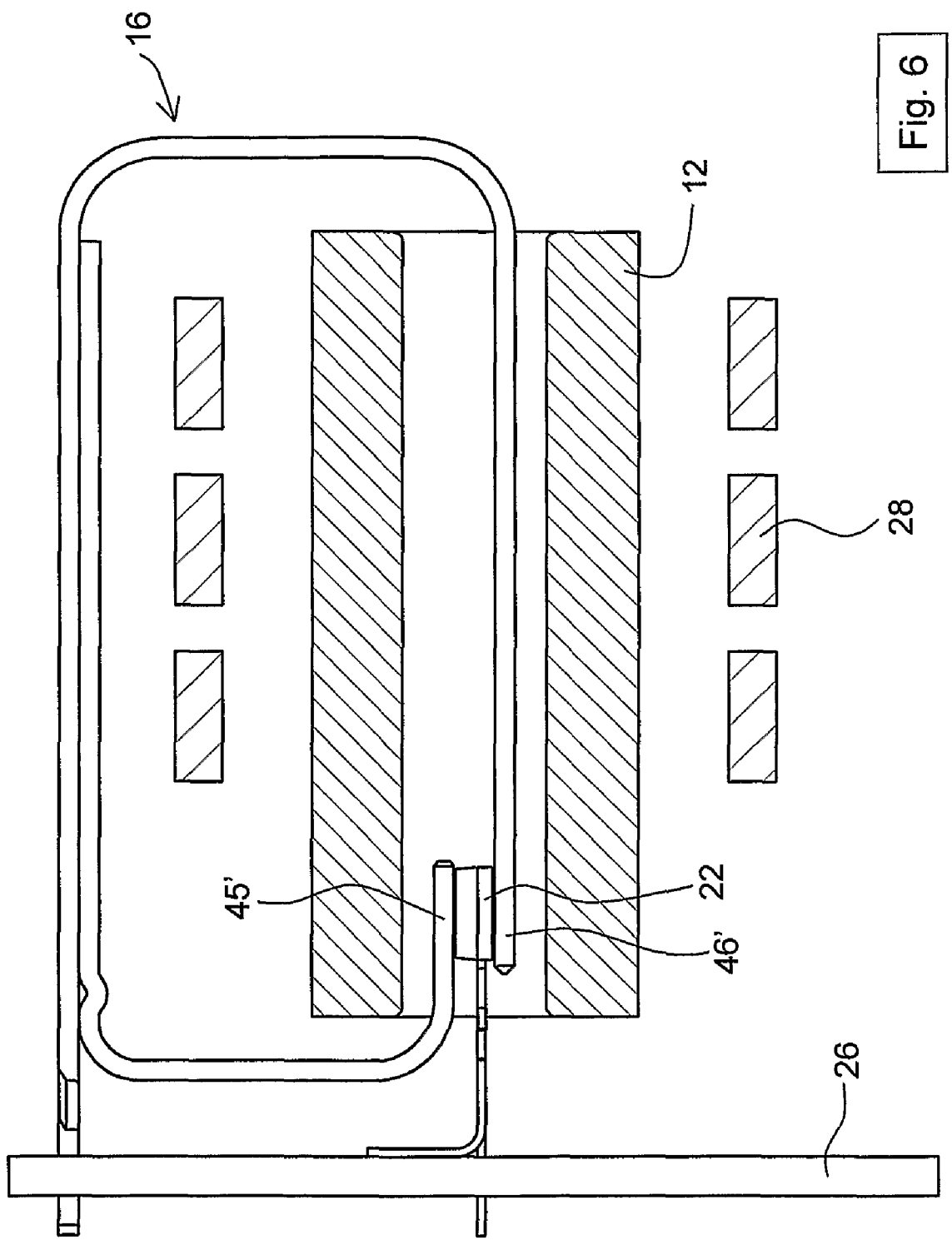

CURRENT SENSOR

The present invention relates to an electrical current sensor, in particular an electrical current sensor with a secondary coil.

Closed-loop current sensors for the measurement of an electrical current flowing in a primary conductor are provided with a secondary coil, whereby the measurement of the primary current is determined by measuring the compensating current injected in the secondary coil in order to annul the magnetic field induced. The amount of compensating current to be applied to the secondary coil is determined by a magnetic field sensor, such as a Hall effect sensor or a flux gate sensor positioned in an air-gap of a magnetic circuit. It is known to connect the secondary coil and magnetic field sensor to a printed circuit board that also comprises other electronic components for signal processing. It is also known to is provide the primary conductors in the form of U-shaped conductors that surround a branch of the magnetic circuit and that have connection ends for connection to a printed circuit board, as described in U.S. Pat. No. 5,004,974. The afore described arrangement of primary conductors increases the range of use of the sensor, since the number of turns of the primary conductor around the magnetic circuit can be easily modified from one sensor to another by appropriate interconnection of the U-shaped pin turns on the circuit board.

The electrical current sensor described in the aforementioned patent is reliable, performant and versatile and also forms a compact unit. The assembly and interconnections of the various components thereof however make it fairly time-consuming and costly to manufacture, particularly on a large series industrial scale. It would also be an advantage to further increase the range of use and the dynamic performance of a sensor of the aforementioned type while maintaining the unit as compact as possible.

In view of the foregoing, an object of this invention is to provide an electrical current sensor with secondary coil and integrated primary conductors, that is compact and economic to manufacture.

It is a further object to provide a closed-loop current sensor that is versatile, in particular that can measure a large range of electrical currents and that has good dynamic performance.

Objects of this invention have been achieved by providing the electrical current sensor according to claim 1.

Disclosed herein is an electrical current sensor comprising a magnetic circuit with an air-gap, a magnetic field sensor positioned in the air-gap, and a secondary coil assembly surrounding a branch of the magnetic circuit, wherein the magnetic circuit comprises at least two parts that are assembled together, a branch portion of each part being insertably received in a central cavity of the secondary coil assembly in an axial direction and overlapping each other, the air-gap being arranged between said overlapping branch portions. The magnetic field sensor is thus insertably received in the air-gap substantially parallel to the overlapping branch portions of the magnetic circuit.

Advantageously, the current sensor according to this invention may be very economically assembled in an automated and rapid manner due to the easy assembly of the magnetic circuit portions to the secondary circuit, as well as the magnetic field detector in the air-gap.

The secondary coil assembly may advantageously be provided with a coil wound on a secondary coil housing that supports the coil and defines the central cavity in which the magnetic circuit branch portions are inserted. The secondary coil housing comprises guide and positioning means for positioning the respective branch portions and determining the air-gap therebetween. The secondary coil housing may further be provided with stamped and formed terminals connected to the extremities of the secondary coil and integrally molded therein, having connection ends for connection to a printed circuit board of the current sensor. The secondary coil housing may also be provided with a cavity or other fixing means, in which the branches of the magnetic circuit opposite the branch provided with an air-gap are inserted and held together.

The magnetic circuit may advantageously be made from a magnetically permeable strip of sheet metal that is stamped and bent out of the plane of the sheet to form the branches of the magnetic circuit. One of the magnetic circuit parts may advantageously comprise a pin terminal at an extremity thereof for connection on the circuit board of the current sensor. The pin terminal advantageously projects in the same direction as the terminals of the secondary coil assembly, such that the secondary circuit can be plugged to the terminals in a single operation in the axial direction. The magnetic field detector, which is mounted on the printed circuit board, may simultaneously be inserted into the air-gap. The electric connection of the magnetic circuit to the printed circuit board provides an earth connection to avoid any capacitive charge build up in the magnetic circuit, and possibly also an additional mechanical connection.

The secondary coil assembly housing may advantageously have studs or other fixing means for securely fastening to the printed circuit board, which is provided with complementary holes or other fixing means.

The electrical current sensor may advantageously further comprise U-shaped primary conductor portions, stamped and formed of sheet metal, that are partially overmolded in a cover part of the housing. The overmolding of the primary conductor portions in the cover part enables the conductor portions to be accurately positioned with respect to each other and automatically assembled around a branch of the magnetic circuit when the cover part is assembled, by clipping, bonding, welding, or by other means to another housing part assembled thereto. The cover part also advantageously provides the required electrical insulation between the primary conductors and the other conductors in the sensor, in particular the secondary coil and the magnetic circuit, which are at a different voltage level. The secondary coil assembly, magnetic circuit, magnetic field detector and circuit board may be entirely received and positioned in two housing parts that are clipped together. One of the housing parts may advantageously comprise an integrally molded hinged flap that allows access to the circuit board for testing purposes during the manufacturing process, the flap being closable by clipping or welding, or otherwise, once the testing is complete.

The U-shaped primary conductor portions may be arranged adjacent to each other in an offset manner so as to increase the distance between adjacent contacts, thus allowing a more compact layout of primary conductor terminals for connection to a complementary PCB. This also allows a greater number of U-shaped conductor portions to be mounted in the sensor housing, thus increasing the possible number of primary conductor turns and thus the range of use of the sensor while retaining a very compact overall configuration.

Further objects and advantageous features of the invention will be apparent from the claims and the following description and drawings, in which:

FIGS. 4a and 4b are cross-sectional views through embodiments of a housing cover part of the current sensor according to this invention, FIG. 4a showing overmoulded conductor terminals and FIG. 4b conductor portions inserted into cavities of the housing cover part;

FIG. 6 is a view in cross-section showing a magnetic circuit and a variant of a magnetic circuit of the sensor according to this invention.

Figure 1:
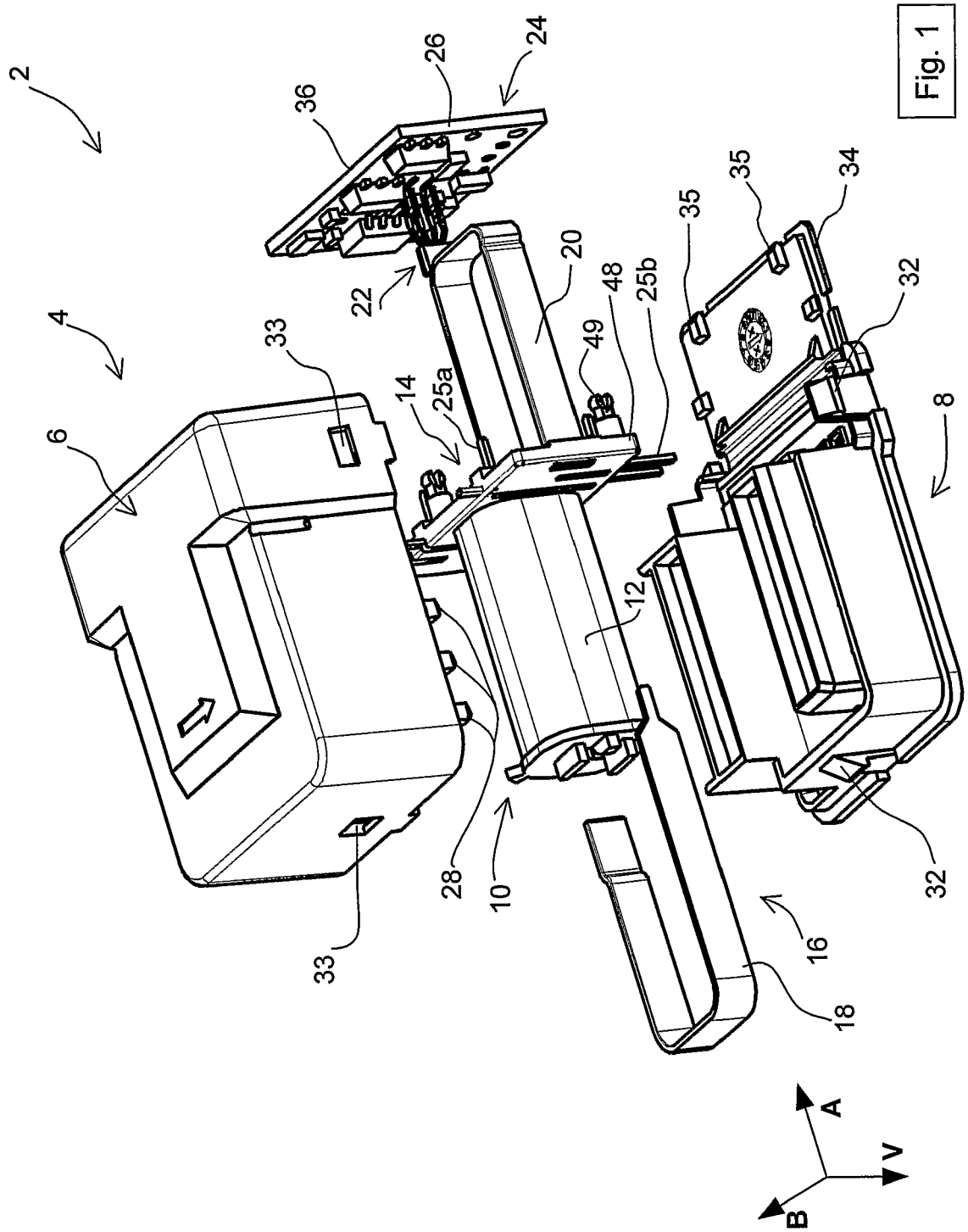
FIG. 1 is an exploded perspective view of a current sensor according to this invention.

Referring to the figures, an electrical current sensor 2 comprises a housing 4 with a cover part 6 and a base 8, a secondary coil assembly 10 comprising a secondary coil 12 wound on a secondary coil housing 14, a magnetic circuit 16 comprising first and second separate portions 18, 20, a magnetic field detector 22, and a signal processing circuit 24 comprising a printed circuit board 26 on which the magnetic field detector is mounted, as well as other electronic components for controlling the current supplied to the secondary coil and processing the measurement signal.

The sensor may further comprise U-shaped primary conductor portions 28 that are mounted around a portion of the magnetic circuit, in this embodiment a substantially rectilinear branch of the magnetic circuit. A magnetic field is generated by the primary current to be measured in the magnetic circuit, that is picked up by the magnetic field detector positioned in an air-gap 30 of the magnetic circuit. The signal processing circuit 24 seeks to cancel the magnetic field detected by the magnetic field detector by applying a compensating current in the secondary coil 12 that generates a magnetic field of essentially the same magnitude, but opposite direction to the magnetic field generated by the primary conductors. This is the functional principle of so-called closed-loop type sensors that are per se well-known in the art.

The magnetic field detector 22 may be a Hall effect detector which finds widespread use in current sensors in view of its relatively low cost and reliable and accurate performance. Other magnetic field detectors may however also be implemented within the scope of the present invention.

The embodiment of the electrical current sensor shown in FIG. 1 is designed to be mounted and electrically connected to a printed circuit board of an external device or apparatus (not shown) that requires a current measurement sensor. The circuit board of the external apparatus may be provided with circuit traces or other conducting parts to connect in various configurations, the U-shaped conductors of the electrical current sensor, so as to create one or a chosen select number of primary conductor turns around the magnetic circuit. This allows the electrical current sensor to be configured for different operating ranges and is per se known in the art.

Figure 3A:
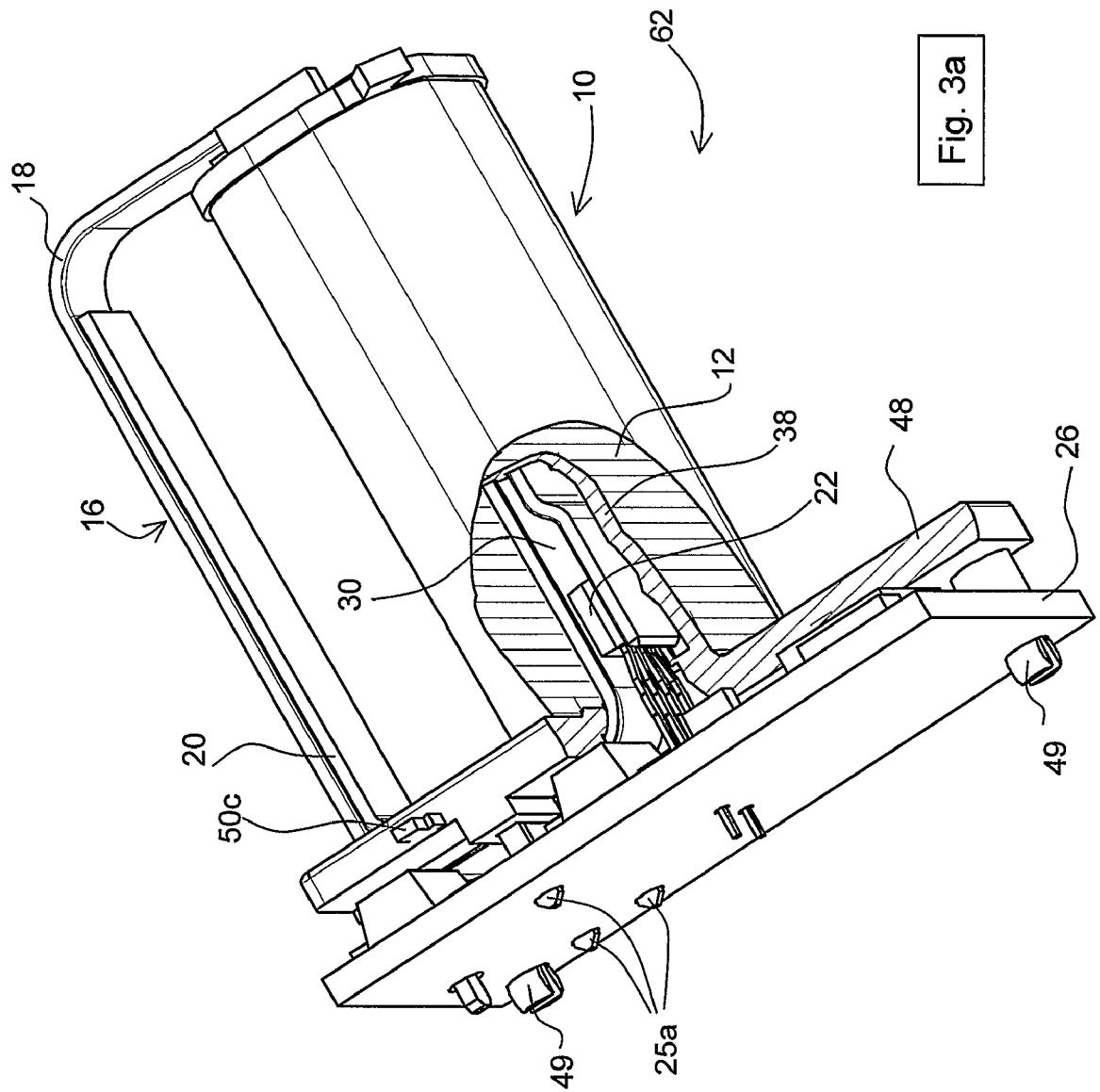
FIG. 3a is a view in perspective, with partial cross-section, of the sensor with the housing parts removed.

In the present invention, the U-shaped primary conductor portions 28 are advantageously directly fixed in the cover part 6 that also serves to close and protect therein the printed circuit board, magnetic circuit and secondary coil assembly by fastening to the complementary base part 8. The base part 8 may be provided with various positioning and guide means to receive and position the secondary coil assembly 10, magnetic circuit 16 and printed circuit board 26, that are assembled together beforehand to form a unit as shown in FIG. 3a. The unit shown in FIG. 3a can thus be mounted in the base part 8 by insertion thereinto in the direction V as shown in FIG. 1, and subsequently the cover part 6 with primary conductor portions 28 clipped thereover to the base part 8. As shown in FIG. 4a, the conductor portions 28 may advantageously be fixed to the cover part by overmoulding a portion of the conductor portions. Alternatively, the conductor portions 28 may be inserted into corresponding cavities in the cover part 6a, 6b. The injection molded housing parts 6, 8 may advantageously be provided with complementary fastening means in the form of clips and complementary latching shoulders 32, 33, but could also be bonded together by other means, such as ultrasound welding, in order to automate the manufacturing steps.

The sensor housing advantageously comprises a closable flap 34 hingeably attached to one of the housing parts, in this embodiment the base part 8. The flap 34 is positioned adjacent the circuit board 24, and allows access to the outer side 36 of the circuit board for testing purposes after the sensor has been assembled. Once testing is complete, the flap can be pivoted to close the housing and protect the circuit board. The flap may be provided with latching means 35 to clip onto complementary latching shoulders of the housing when it is closed. The flap may also be permanently bonded to the housing after testing by other means, such as ultrasound welding, or with an adhesive.

Figure 2:
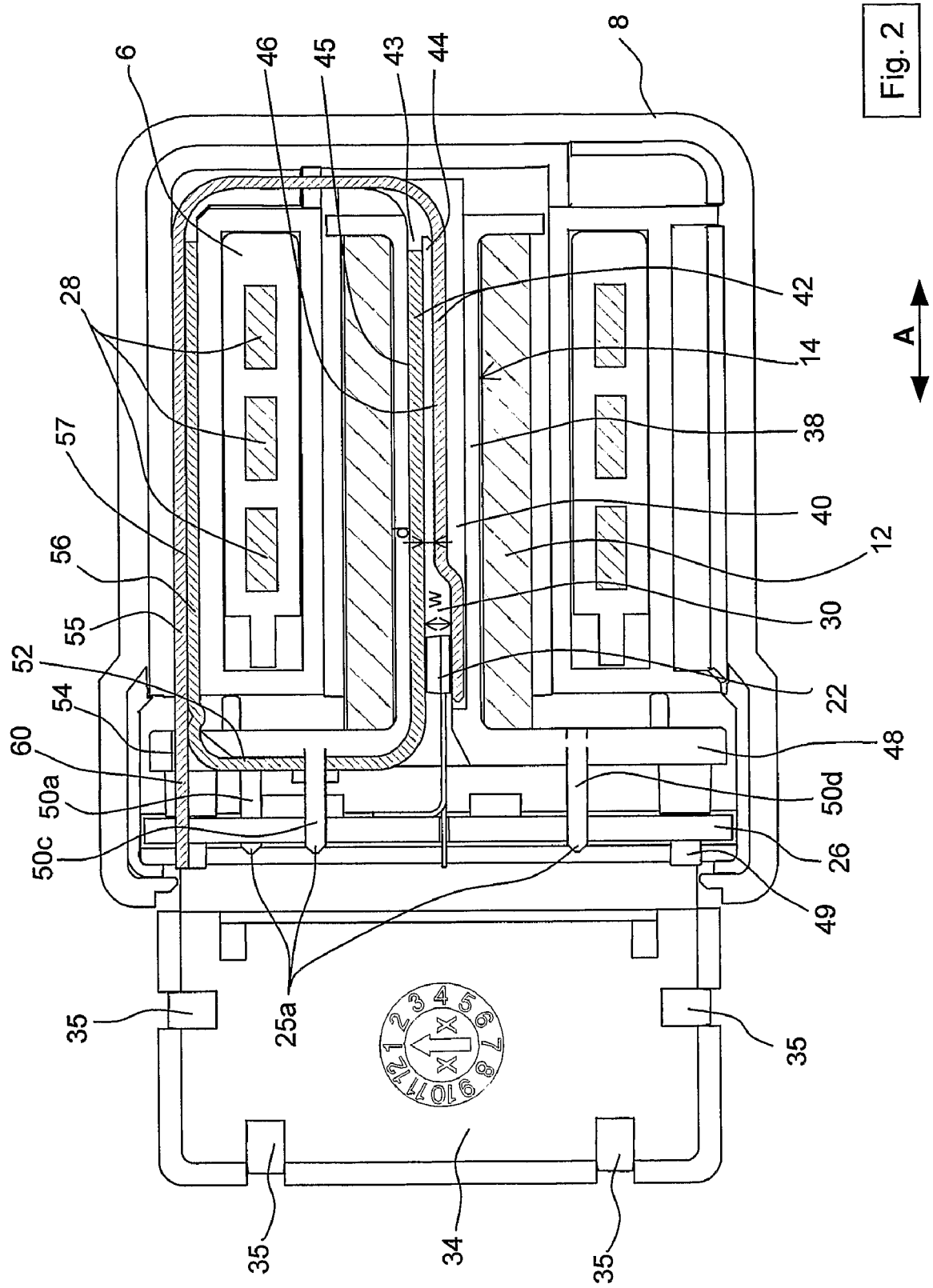
FIG. 2 is a cross-sectional view through the current sensor of FIG. 1.
Figure 3B:
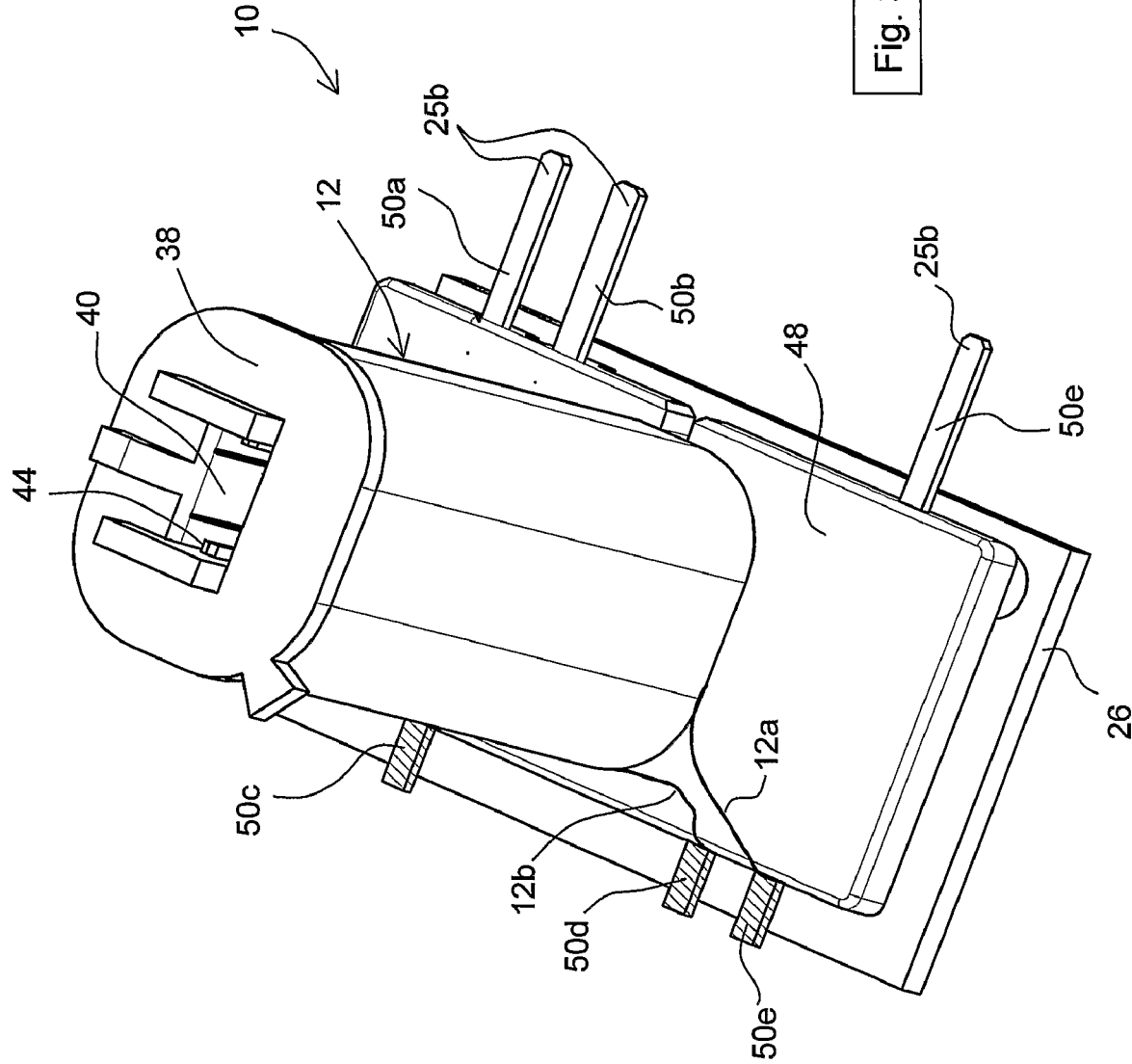
FIG. 3b is a view in perspective of a secondary coil assembly of the sensor according to this invention.
Figure 3C:
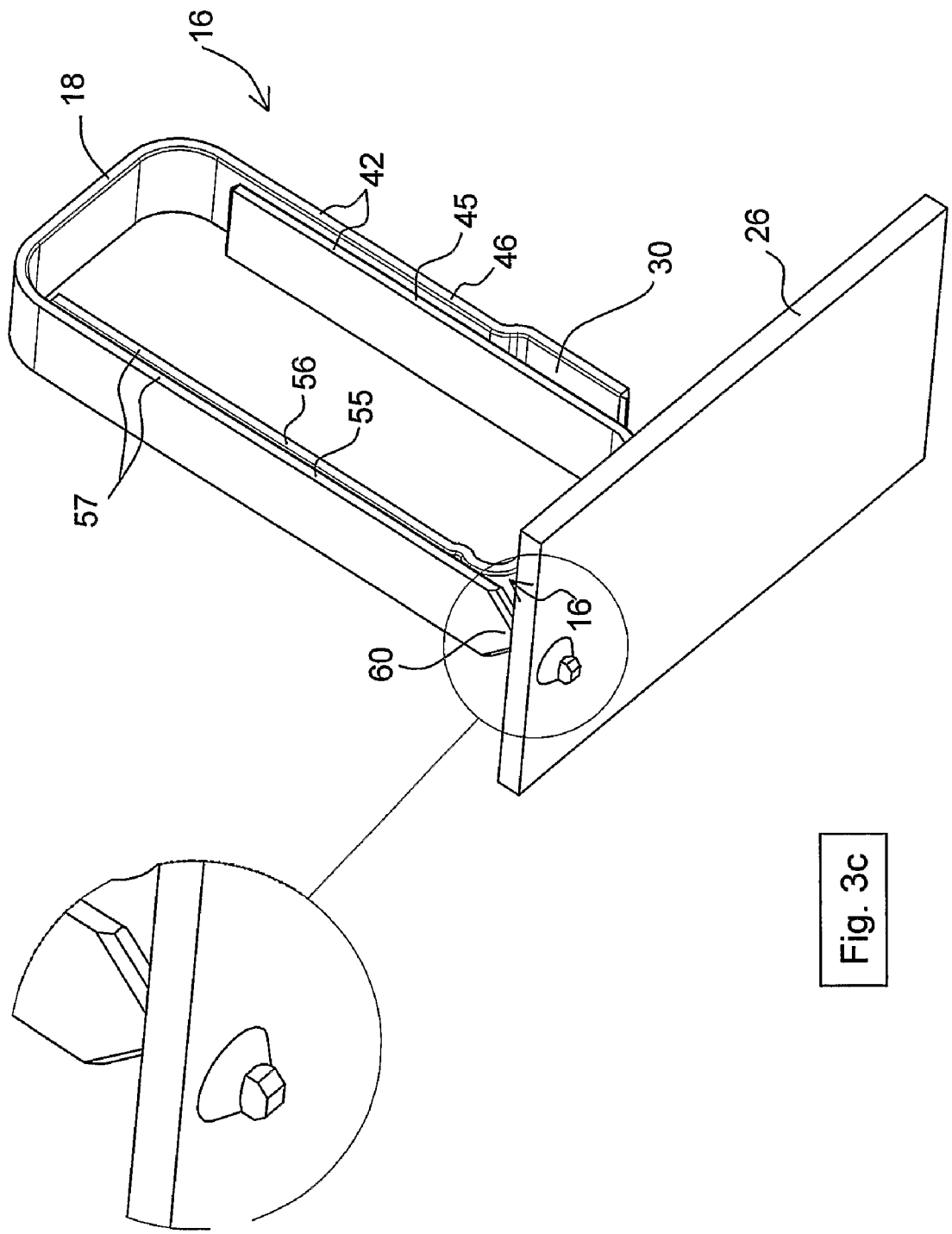
FIG. 3c is a perspective view of a magnetic circuit, mounted on a printed circuit board of the sensor according to this invention.

With reference in particular to FIG. 2 to FIG. 3c, the sensor components received within the housing will now be described in more detail.

The secondary coil assembly 10 has a secondary coil 12 wound around a coil support portion 38 of the secondary coil housing 14, the coil support portion having a cavity 40 extending therethrough for receiving a branch 42 of the substantially rectangular shaped magnetic circuit, along which the air-gap 30 is disposed and in which the magnetic field sensor 22 is positioned. The secondary coil thus surrounds the air-gap and magnetic field sensor in order to ensure that the magnetic field generated by the secondary coil is coupled most effectively to the magnetic field detector.

The support cavity 40 is advantageously provided with guide means, for example in the form of grooves or appropriate projections 43, 44 for positioning and guiding the separate extensions 45, 46 of the magnetic circuit branch 42. The magnetic circuit extensions 46, 45 advantageously overlap and are separated by a distance D that is smaller than the width W of the air-gap in order to improve the frequency response of the magnetic circuit, and thus the frequency response of the electrical current sensor. It may however be noted that the magnetic circuit may also be provided without overlapping extensions other than those 45', 46' provided on either side of the magnetic field sensor to establish the air-gap, as shown in FIG. 6.

The secondary coil assembly housing may further be provided with a base portion 48 comprising fixing means, such as elastic studs 49, for pluggably fixing the secondary coil assembly 10 to the circuit board 26. Electrical terminals 50a, 50b, 50c, 50d, 50e may be fixed to the base portion, for example by overmoulding, bonding, welding or force-fit insertion in cavities in the base portion. The terminals are provided with connection ends 25b for pluggable and/or solder connection to an external PCB, and/or connection ends 25a for pluggable and/or solder connection to the circuit board 26 of the signal processing unit. The terminals 50d, 50e are connected to the extremities 12a, 12b of the secondary coil, whereby one of the terminals 50e is adapted to be connected directly to an external PCB (not shown) to which the sensor is mounted, and the other terminal 50d is connected to the signal processing unit 24. The terminal 50c is connected to the shield around the secondary coil and to the signal processing unit 24 for the purpose of shielding the secondary coil from external electromagnetic noise, as well as reducing the emission of noise from the secondary coil. The terminals 50a, 50b are connected to the signal processing unit and to the external PCB and are adapted to supply the sensor in electrical energy.

The secondary coil housing base portion 48 may also support a branch 52 of the magnetic circuit and comprise a cavity 54 that acts as positioning means for receiving therethrough overlapping extensions 55, 56 of a branch 57 of the magnetic circuit opposed to the branch 42 in which the air-gap 30 is provided. The two extensions 55, 56 are held together in the housing in contact with each other, in order to lessen resistance to the magnetic induction.

The magnetic circuit 16 may advantageously be stamped and formed out of a magnetically permeable strip of sheet metal in two parts 18, 20, that may be assembled together by mounting on the secondary coil assembly 10, in particular by insertion in an axial direction A, as shown in the figures. The magnetic circuit may therefore be rapidly and easily assembled to the secondary coil assembly 10 which in turn may be rapidly and easily assembled to the circuit board 26 which is plugged thereto to form a unit 62 received in the base 8 of the housing which is subsequently closed with the cover part 6. All the assembly steps may thus be easily automated.

An extension of one of the magnetic circuit parts 18 may further comprise a PCB contact portion 60 for connection to an earth connection on the printed circuit board to avoid a capacitive charge building up in the magnetic circuit.

The orientation of the air-gap 30 between two parallel extensions 45, 46 of the magnetic circuit is particularly advantageous, since it allows the axial insertion of the magnetic field detector 22 into the air-gap 30 when a secondary coil assembly 10 is fixed to the circuit board 26 on which the magnetic field detector 22 is preassembled.

The air-gap 30 of non-constant width (d, w) over the length of the adjacent extensions 45, 46 of the magnetic circuit increases the coupling coefficient of the equivalent transformer, thus improving the performance of the sensor in alternating current, in particular increasing the bandwidth and the responsiveness to variations in the current di/dt.

Figure 5A:
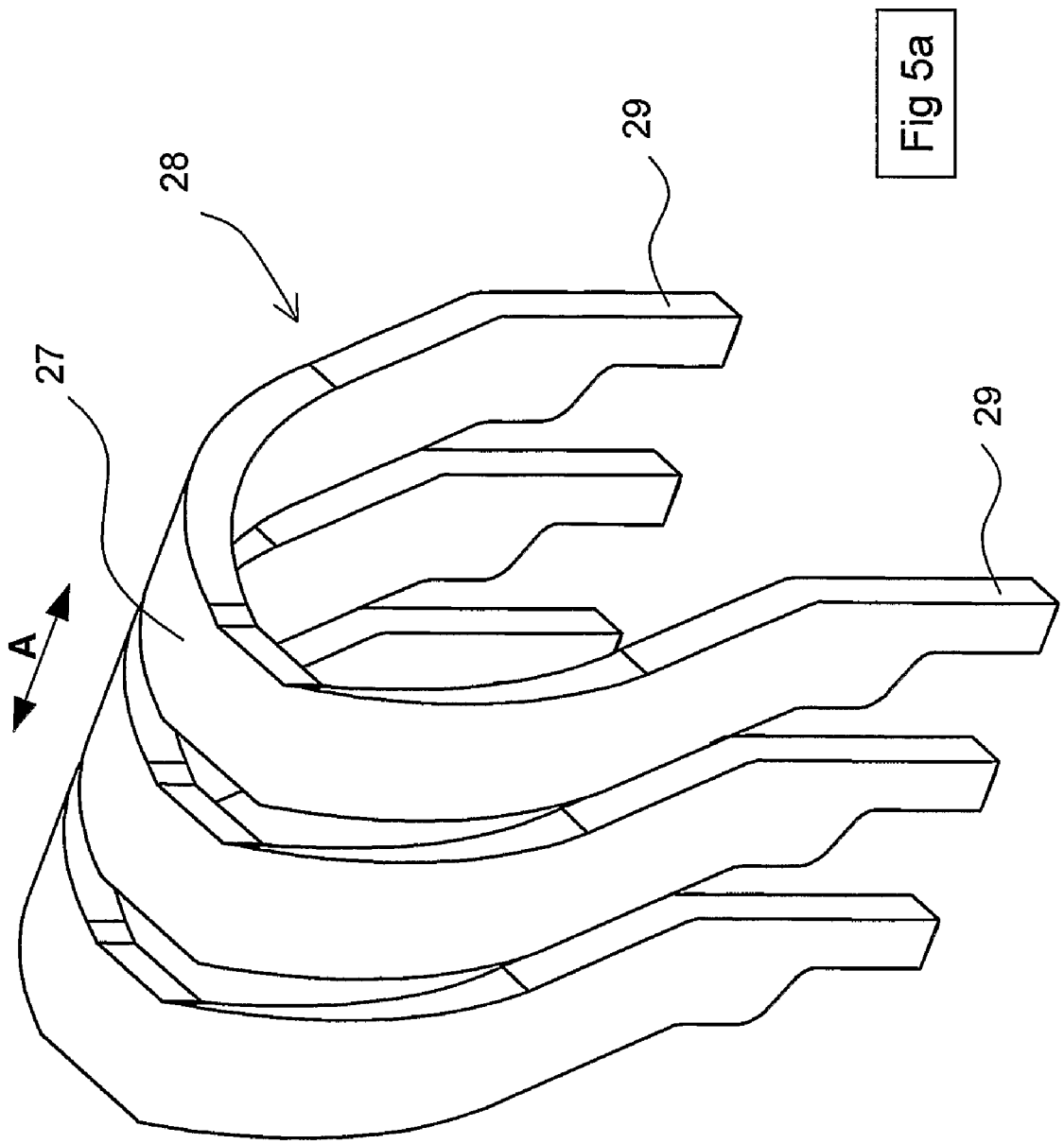
FIG. 5a is a view in perspective of a variant of an arrangement of U-shaped primary conductor portions that may be implemented in a sensor according to this invention.

Referring to FIG. 5a, the U-shaped primary conductor portions may advantageously have connection extremities 29, that are offset in the axial direction A with respect to the intermediate portion 27 in order to increase the distance between the connection ends 29 and the terminals 25 of the secondary coil assembly. This configuration enables the sensor to be very compact yet respect the requirements and standards for electrical separation between the primary and secondary circuits, as well as achieve good magnetic coupling between the U-shaped primary conductor portions and the secondary coil.

Figure 5B:
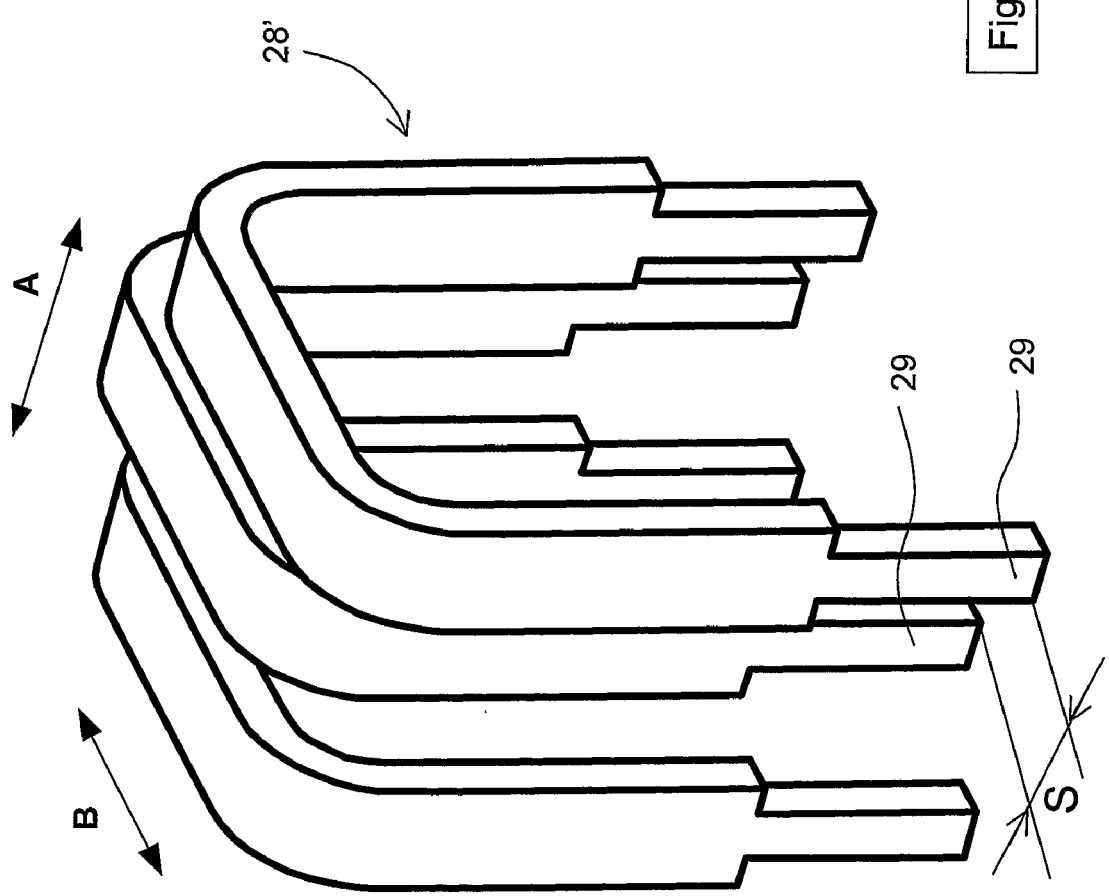
FIG. 5b is a view in perspective of another variant of an arrangement of U-shaped primary conductor portions that may be implemented in a sensor according to this invention.

Referring to FIG. 5b the U-shaped primary conductor portions may be staggered in a direction B perpendicular to the axial direction A, so as to increase the distance S between connection extremities 29 of adjacent terminals. This enables the conductor portions to be positioned close together to decrease the foot-print surface area required for connection of the conductor terminals (to an external apparatus) or to enable a larger number of conductor portions to be provided in the sensor, while maintaining the sensor as compact as possible.

The invention claimed is:

1. Electrical current sensor comprising a sensor housing, a magnetic circuit with an air-gap, a magnetic field sensor positioned in the air-gap, and a secondary coil assembly comprising a secondary coil housing and a secondary coil wound around the secondary coil housing, the secondary coil housing comprising a central cavity extending between opposed first and second ends of the secondary coil housing, wherein the magnetic circuit comprises separate first and second parts that are assembled together, a first branch portion of said first part being insertably received in said central cavity from said first end of the secondary coil housing, and said second part insertably received in said central cavity from said second end of the secondary coil housing, and wherein the air-gap is arranged between overlapping end portions of said first and second branch portions, said overlapping end portions being positioned within the central cavity of the secondary coil housing.

2. Sensor according to claim 1, wherein the magnetic field sensor is insertably received in the air-gap substantially parallel to the first and second branch portions of the magnetic circuit.

3. Sensor according to claim 1, wherein the secondary coil housing comprises guide and positioning means in the central cavity for positioning said first and second branch portions received therein and for determining the air-gap therebetween.

4. Sensor according to claim 1, further comprising a signal-processing unit mounted in the sensor housing and connected to the secondary coil.

5. Sensor according to claim 4, wherein the secondary coil assembly comprises terminals overmolded in a base portion of the secondary coil housing and having connection ends configured for interconnecting the secondary coil, the signal-processing unit and an external circuit board.

6. Sensor according to claim 4, wherein the signal-processing unit comprises a circuit board and the magnetic circuit and secondary coil assembly are assembled to said circuit board and said magnetic field sensor insertable in said air-gap in a direction (A) essentially parallel to said first and second branch portions of said magnetic circuit.

7. Sensor according to claim 1, wherein the at least two parts of the magnetic circuit are made from a magnetically permeable strip of stamped sheet metal.

8. Sensor according to claim 7, wherein one of said magnetic circuit parts comprises a pin terminal for connection to a circuit board of the sensor.

9. Sensor according to claim 1, further comprising a housing formed of a base part and a separate molded cover part assembled to the base part and receiving therein the magnetic circuit, secondary coil assembly, and magnetic field sensor.

10. Sensor according to claim 9, further comprising U-shaped primary conductor portions configured to carry a primary current to be measured, wherein said U-shaped primary conductor portions are partially overmolded in the cover part and arranged to partially surround said secondary coil assembly and said first and second branch portions of said magnetic circuit.

11. Sensor according to claim 1, comprising a plurality of juxtaposed U-shaped primary conductor portions, whereby adjacent conductor portions are offset in relation to each other configured to increase the distance between connection extremities of the adjacent conductor portions.

12. Sensor according to claim 4, wherein the sensor housing includes a hingeable flap positioned adjacent the signal processing circuit configured to allow access to the signal processing circuit during manufacturing for testing purposes.

13. Electrical current sensor comprising a magnetic circuit with an air-gap, a magnetic field sensor positioned in the air-gap, U-shaped primary conductor portions configured to carry said primary current to be measured at least partially surrounding a portion of the magnetic circuit, a signal processing circuit comprising a circuit board, a secondary coil assembly configured to generate a compensating magnetic field, and a sensor housing receiving therein the magnetic circuit, signal processing circuit and secondary coil assembly, the secondary coil assembly comprising a secondary coil housing and a coil wound around the secondary coil housing and connected to the circuit board, the secondary coil housing comprising a central cavity extending between opposed first and second ends of the secondary coil housing, wherein the magnetic circuit comprises separate first and second parts that are assembled together, a first branch portion of said first part being insertably received in said central cavity from said first end of the secondary coil housing, and said second part insertably received in said central cavity from said second end of the secondary coil housing, and wherein the air-gap is arranged between overlapping end portions of said first and second branch portions, said overlapping end portions being positioned within the central cavity of the secondary coil housing.

14. Electrical current sensor for measuring a primary current comprising a magnetic circuit with an air-gap, a magnetic field sensor positioned in the air-gap, a secondary coil configured to carry a compensating current to generate a compensating magnetic field, the secondary coil surrounding a branch of the magnetic circuit, U-shaped primary conductor portions configured to carry said primary current to be measured at least partially surrounding a portion of the magnetic circuit, a signal processing circuit, and a housing formed of a base part and a separate molded cover part assembled to the base part and covering the magnetic circuit, secondary coil, signal processing circuit and magnetic field sensor received in the housing, wherein the U-shaped primary conductor portions are preassembled to said cover part and permanently affixed thereto.

15. Sensor according to claim 14, wherein the U-shaped primary conductor portions are partially overmolded in said cover part.

16. Sensor according to claim 15, wherein the magnetic circuit comprises at least two parts that are assembled together, a branch of each part being received in a central cavity of the secondary coil, and wherein the air-gap is arranged between overlapping branch portions of said magnetic field circuit parts.

17. Sensor according to claim 14, wherein the magnetic field sensor is insertably received in the air-gap substantially parallel to the adjacent branch of the magnetic circuit.

18. Sensor according to claim 14, wherein the secondary coil is wound on a secondary coil housing that supports the coil and defines the central cavity.

19. Sensor according to claim 14, wherein the secondary coil housing comprises guide and positioning means in the central cavity for positioning said branch portions received therein and determining the air-gap there-between.

20. Sensor according to claim 14, wherein the secondary coil housing comprises terminals overmolded in a base portion of the housing and having connection ends for interconnecting the secondary coil, the signal-processing unit and an external circuit board.

21. Sensor according to claim 14, wherein the magnetic circuit and secondary coil assembly comprising said secondary coil and said secondary coil housing are assembled to a signal-processing unit comprising a circuit board and said magnetic field sensor insertable in said air-gap in a direction (A) essentially parallel to said branch portions of said magnetic circuit.

22. Sensor according to claim 14, wherein the at least two parts of the magnetic circuit are made from a magnetically permeable strip of sheet metal that is stamped and bent out of the plane of the sheet to form branches of the magnetic circuit.

23. Sensor according to claim 22, wherein one of said magnetic circuit parts comprises a pin terminal for connection to a circuit board of the sensor.

24. Sensor according to claim 14, wherein adjacent conductor portions are offset in relation to each other in order to increase the distance between connection extremities of the adjacent conductor portions.

25. Sensor according to claim 13, comprising a housing including a hingeable flap positioned adjacent a signal processing circuit of the sensor for allowing access to the signal processing circuit during manufacturing for testing purposes.

\* \* \* \* \*